United States Patent
Yoshimoto et al.

(10) Patent No.: US 8,692,112 B2
(45) Date of Patent: Apr. 8, 2014

(54) ORGANIC THIN FILM SOLAR CELL AND FABRICATION METHOD OF SAME

(75) Inventors: Naoki Yoshimoto, Hitachinaka (JP); Hiroto Naito, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 658 days.

(21) Appl. No.: 12/343,647

(22) Filed: Dec. 24, 2008

(65) Prior Publication Data

US 2009/0165861 A1    Jul. 2, 2009

(30) Foreign Application Priority Data

Dec. 27, 2007 (JP) ................. 2007-335508

(51) Int. Cl.
*H01L 51/42* (2006.01)

(52) U.S. Cl.
USPC ...... 136/263; 136/252; 438/82; 257/E21.002; 257/E31.002

(58) Field of Classification Search
USPC ............ 136/263, 252; 438/82; 257/E21.002, 257/E31.002
See application file for complete search history.

(56) References Cited

U.S. PATENT DOCUMENTS

| | | | | |
|---|---|---|---|---|
| 2002/0040728 A1* | 4/2002 | Yoshikawa | .................... | 136/263 |
| 2002/0108649 A1* | 8/2002 | Fujimori et al. | ............... | 136/263 |
| 2005/0224113 A1* | 10/2005 | Xue et al. | ........................ | 136/263 |
| 2006/0008740 A1* | 1/2006 | Kido et al. | ..................... | 430/296 |
| 2006/0027834 A1* | 2/2006 | Forrest et al. | .................. | 257/183 |
| 2006/0060239 A1* | 3/2006 | Peumans et al. | ............... | 136/263 |
| 2006/0112983 A1* | 6/2006 | Parce et al. | .................... | 136/250 |

FOREIGN PATENT DOCUMENTS

| | | |
|---|---|---|
| JP | 2002-222970 | 8/2002 |
| JP | 2005-236278 | 9/2005 |

OTHER PUBLICATIONS

Japanese Office Action of Appln. No. 2007-335508 dated Mar. 30, 2010 with partial translation.

* cited by examiner

*Primary Examiner* — Golam Mowla

(74) *Attorney, Agent, or Firm* — Antonelli, Terry, Stout & Kraus, LLP.

(57) ABSTRACT

An organic thin film solar cell comprises: positive and negative electrode layers; and an organic thin film layer disposed between the positive and negative electrode layers, the organic thin film layer including: a mixture of at least a first organic compound having a light-absorbing dye moiety and an electron-accepting second organic compound, in which the organic thin film layer further includes inorganic nanoparticles.

13 Claims, 4 Drawing Sheets

ORGANIC THIN FILM SOLAR CELL AND FABRICATION METHOD OF SAME

CLAIM OF PRIORITY

The present application claims priority from Japanese patent application serial no. 2007-335508 filed on Dec. 27, 2007, the content of which is hereby incorporated by reference into this application.

BACKGROUND OF THE INVENTION

1. Field of the Invention

The present invention relates to organic thin film solar cells having a thin film in which a light-receiving layer is formed at a junction between two dissimilar organic semiconductors.

2. Description of Related Art

In order to use natural energy resources more efficiently, solar photovoltaic systems are being actively developed. Most of today's solar cells for photovoltaic generation use single- and poly-crystalline silicon as a starting material. However, they have not yet been put into widespread commercial use because of such problems as unstable supply of crystalline silicon and difficult-to-reduce relatively high manufacturing costs.

In this situation, solar cells which do not use crystalline silicon are being developed. Such known solar cells include: CIS solar cells which use a thin film of a compound semiconductor containing copper (Cu), indium (In), selenium (Se), etc.; dye sensitized solar cells that generate electricity by an electrochemical mechanism provided by a combination of a metal oxide such as a titanium (Ti) oxide and an organic dye; and organic film solar cells that form a junction between a conjugated polymer and an electron-accepting molecule by an appropriate method. These solar cells have the advantages of stable material supply and a relatively simple manufacturing process. In particular, organic thin film solar cells, having an overall thickness of 1 µm or less, offer advantages in applicability to flexible solar cells (such as lightweight and flexibility), and also have an advantage in simple manufacturing.

A basic structure of an organic thin film solar cell will now be described. FIG. 9 is a schematic cross-sectional view illustrating a principal structure of a planar heterojunction organic thin film solar cell. The organic thin film solar cell of FIG. 9 includes: a transparent electrode 111 which is formed by stacking a transparent conductive film 102 (e.g., tin-doped indium oxide [ITO]) on a transparent substrate 101 (e.g., a glass substrate); a light-absorbing dye 501 (e.g., a copper phthalocyanine and a conjugated polymer) stacked on the transparent conductive film 102; an electron-accepting molecule 1002 (e.g., a fullerene derivative) stacked on the light-absorbing dye 501; and a rear electrode 106 (e.g., aluminum [Al]) stacked on the electron-accepting molecule 1002. In such organic thin film solar cells, the photoelectric conversion reaction is confined to the junction plane between the light-absorbing dye 501 and the electron-accepting molecule 1002. So, it is generally accepted that such a two-dimensional planar junction as shown in FIG. 9 can produce only a relatively small amount of photogenerated charge because of the above-mentioned limited junction (reaction) area, thus resulting in poor photoelectric conversion efficiency.

Under this circumstance, in order to increase the photogenerated charge of an organic thin film solar cell, attempts are being made to increase the junction area between the light-absorbing dye and the electron-accepting molecule. FIG. 10 is a schematic cross-sectional view illustrating a principal structure of a bulk heterojunction organic thin film solar cell. In the bulk heterojunction organic thin film solar cell of FIG. 10, a solution of a mixture of a light-absorbing conjugated polymer 1001 (e.g., 2-methoxy-5-(2'-ethylhexyloxy)-1,4-phenylene vinylen) and a fullerene derivative 1002 is applied on a hole transport layer 103 by an appropriated method to form a thin film of the mixture. In this case, the conjugated polymer 1001 and the fullerene derivative 1002 are phase separated in the mixture film, thus creating multiple junctions between the thus separated two phases. Such a structure is considered to be able to provide a larger junction area than structures in which the junction is provided by stacking planar films (e.g., see Nonpatent Document 1).

Nonpatent Document 1: Christoph J. Brabec, N. Serdar Sariftci, and Jan C. Hummelen: Adv. Funct. Mater. 2001, 11, p. 15.

As described above, in bulk heterojunction organic thin film solar cells, a mixture of a light-absorbing conjugated polymer and a low-molecular-weight, electron-accepting organic compound molecule is phase separated to form multiple junctions between the two materials. Such a structure is considered to increase the junction area and therefore increase the photogenerated charge, thus leading to an increase in photoelectric conversion efficiency.

As for the charge generation mechanism of an organic thin film solar cell, it is usually explained by extraction of electrons by the electron-accepting molecule from the light-absorbing dye which has absorbed light. In order to achieve a high efficiency organic thin film solar cell, design and application of a molecule with strong electron-accepting properties is necessary. At present, molecules satisfying such excellent electron-accepting properties are limited to only a few materials such as fullerene derivatives and perylene derivatives. Unfortunately, these electron-accepting molecules exhibit only relatively weak electron-accepting properties and can therefore produce only a limited amount of photogenerated charge.

In this situation, in order to obtain materials having improved electron-accepting properties, efforts are being made to use, as an electron acceptor, inorganic nanoparticles which have more excellent electron-accepting properties than the aforementioned fullerene derivatives and perylene derivatives. Inorganic nanoparticles typified by CuIn nanoparticles have more excellent electron-accepting properties than organic nanoparticles. However, any attempt to use such inorganic nanoparticles in a bulk heterojunction organic thin film solar cell has so far failed to improve the photoelectric conversion efficiency. In order to make effective use of inorganic nanoparticles as the electron acceptor of a bulk heterojunction organic thin film solar cell, the inorganic nanoparticles need to assume a percolation structure in which they are beaded. To achieve such a percolation structure, inorganic nanoparticles need to be contained in a high concentration, typically more than 40 wt %. However, organic thin film solar cells are thin, so excessive incorporation of such inorganic nanoparticles can cause such problems as degradation in the light absorbing properties and short-circuiting of the thin films of the cell, thus hampering improvement in the photoelectric conversion efficiency. As described above, it is generally difficult to achieve the percolation structure of inorganic nanoparticles in an organic thin film solar cell without sacrificing other important properties.

SUMMARY OF THE INVENTION

Under these circumstances, in order to address the above problems, it is an objective of the present invention to provide a bulk heterojunction organic thin film solar cell having a photoelectric conversion efficiency higher than those of conventional bulk heterojunction organic thin film solar cells. Furthermore, it is another objective of the present invention to provide a manufacturing method of a bulk heterojunction organic thin film solar cell having a photoelectric conversion efficiency higher than those of conventional bulk heterojunction organic film solar cells.

(1) According to one aspect of the present invention, there is an organic thin film solar cell provided which comprises: positive and negative electrode layers; and an organic thin film layer disposed between the positive and negative electrode layers, the organic thin film layer including: a mixture of at least a first organic compound having a light-absorbing dye moiety and an electron-accepting second organic compound, in which the organic thin film layer further includes inorganic nanoparticles.

In the above aspect (1) of the present invention, the following modifications and changes can be made.

(i) The organic thin film layer has an uneven concentration distribution of the inorganic nanoparticles in the direction normal to the positive and negative electrode layers so that the inorganic nanoparticles are more heavily concentrated near the negative electrode layer.

(ii) The light-absorbing dye moiety has a n-conjugated structure.

(iii) The inorganic nanoparticles have a primary particle diameter of 100 nm or less.

(iv) The inorganic nanoparticles have electron-accepting properties.

(v) An amorphous inorganic thin film layer is further formed between the organic thin film layer and the negative electrode layer.

(vi) In the above modification and change (v), the amorphous inorganic thin film layer contains at least one of the constituent elements of the inorganic nanoparticles.

(2) According to another aspect of the present invention, there is an organic film solar cell provided which comprises: positive and negative electrode layers; an organic thin film layer disposed between the positive and negative electrode layers, the organic thin film layer including a mixture of at least a first organic compound having a light-absorbing dye moiety and an electron-accepting second organic compound; a hole transport layer disposed between the positive electrode layer and the organic thin film layer; and a hole blocking layer disposed between the organic thin film layer and the negative electrode layer in order to suppress leakage of hole current from the organic thin film layer to the negative electrode layer, in which the organic thin film layer further includes inorganic nanoparticles.

In the above aspect (2) of the present invention, the following modifications and changes can be made.

(vii) The organic thin film layer has an uneven concentration distribution of the inorganic nanoparticles in the direction normal to the positive and negative electrode layers so that the inorganic nanoparticles are more heavily concentrated near the negative electrode layer.

(viii) The hole blocking layer is an amorphous inorganic thin film layer.

(ix) On the surface of the hole transport layer opposite to the positive electrode layer there are stacked in the following order: a layer made of the first organic compound; a layer made of a mixture of at least the first and second organic compounds; and a layer made of a mixture of at least the first and second organic compounds and the inorganic nanoparticles.

(3) According to another aspect of the present invention, there is provided a fabrication method for an organic thin film solar cell including positive and negative electrode layers and an organic thin film layer which is disposed between the two electrodes and includes a bulk heterojunction layer, in which the fabrication method includes the steps of: forming a hole transport layer on a surface of the positive electrode layer; forming the organic thin film layer containing inorganic nanoparticles on the exposed surface of the hole transport layer; forming a hole blocking layer for suppressing leakage of hole current from the organic thin film layer on the exposed surface of the organic thin film layer; and forming the negative electrode layer on the exposed surface of the hole blocking layer.

In the above aspect (3) of the present invention, the following modifications and changes can be made.

(x) The step of forming the organic thin film layer includes the steps of: forming the bulk heterojunction layer by applying, on the exposed surface of the hole transport layer, a solution of a mixture of at least a first organic compound having a light-absorbing dye moiety and an electron-accepting second organic compound and by drying the applied solution; and containing the inorganic nanoparticles in the organic thin film layer by applying, onto the exposed surface of the bulk heterojunction layer, a dispersion of the inorganic nanoparticles in a dispersion medium and by drying the applied dispersion.

(xi) The step of forming the organic thin film layer includes the steps of: forming the bulk heterojunction layer by applying, on the exposed surface of the hole transport layer, a solution of a mixture of at least a first organic compound having a light-absorbing dye moiety and an electron-accepting second organic compound and by drying the applied solution; and containing the inorganic nanoparticles in the organic thin film layer by applying, on the exposed surface of the bulk heterojunction layer, a dispersion of the inorganic nanoparticles in the solution of the mixture and by drying the applied dispersion.

(xii) The step of forming the organic thin film layer includes the steps of: forming the bulk heterojunction layer by applying, on the exposed surface of the hole transport layer, a solution of a mixture of at least a first organic compound having a light-absorbing dye moiety and an electron-accepting second organic compound and by drying the applied solution; and containing the inorganic nanoparticles in the organic thin film layer by applying, on the surface of the bulk heterojunction layer, a dispersion of the inorganic nanoparticles in a solution containing at least the second organic compound and by drying the applied dispersion.

Advantages of the Invention

The present invention can provide a bulk heterojunction organic thin film solar cell having a photoelectric conversion efficiency higher than those of conventional bulk heterojunction organic thin film solar cells.

DETAILED DESCRIPTION OF THE PREFERRED EMBODIMENTS

Preferred embodiments of the present invention will be described below with reference to the accompanying drawings. Such embodiments will be presented only by way of example for implementing the invention and not by way of limitation.

First Embodiment

Figure 1:
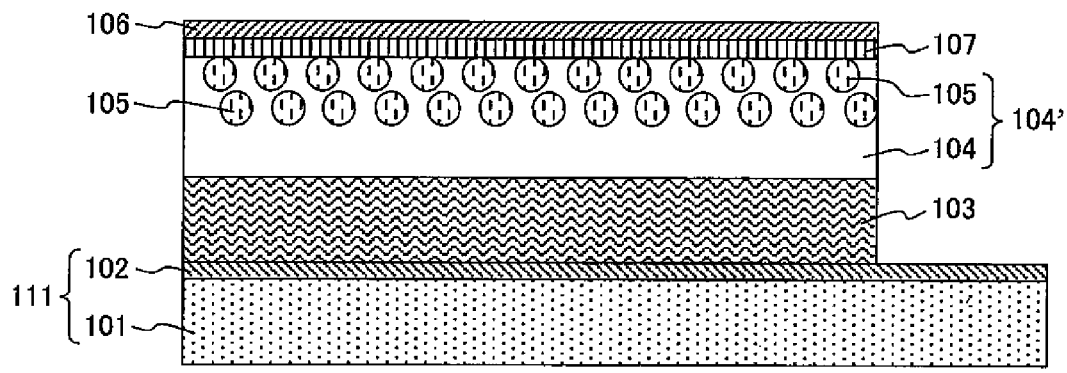
FIG. 1 is a schematic cross-sectional view illustrating a principal structure of a bulk heterojunction organic thin film solar cell according to a first embodiment of the invention.

Combination of Bulk Heterojunction Organic Thin Film Solar Cell and Inorganic Nanoparticles FIG. 1 is a schematic cross-sectional view illustrating a principal structure of a bulk heterojunction organic thin film solar cell according to a first embodiment of the invention. In the schematic cross-sectional view of FIG. 1, the dimensions are not drawn to scale so as to facilitate an understanding of the component materials.

The transparent substrate 101 used in the bulk heterojunction organic thin film solar cell is not particularly limited so long as it is an optically transparent member with smooth surfaces, such as a glass plate. Materials usable for such a substrate include: glasses such as soda-lime glasses and low-soda borosilicate glasses; and plastics such as polyethylene terephthalates (PETs) and polyethylene naphthalates (PENs). As such a plastic substrate, about a 0.1-mm-thick flexible substrate may be used.

Adjacent to the transparent substrate 101 is formed a transparent conductive film 102. The transparent conductive film 102 is not particularly limited as long as it is an optically transparent thin film with a sheet resistance of several ohms/square to several hundreds of ohms/square. Materials usable for the transparent conductive film 102 include: tin-doped indium oxides (ITO); fluorine-doped tin oxides (FTO); and tin-oxide coated glasses (so-called NESA glass). Also, the transparent conductive film 102 may be patterned into any desired shape in order to facilitate measurements or implement a device structure. The transparent substrate 101 and the transparent conductive film 102 are hereinafter collectively referred to as "transparent electrode 111".

On the transparent electrode 111 is formed a hole transport layer 103. The material for the hole transport layer 103 is not particularly limited insofar as it can transport holes and the energy level (with reference to the vacuum energy level) of its highest occupied molecular orbital (HOMO) is lower than the energy levels (represented by the Fermi level) of the transparent conductive film 102. For example, poly(3,4-ethylenedioxythiophene)/sodium poly(styrene sulfonate) (known as PEDOT/PSS), etc. can be used. The hole transport layer 103 is formed by spin coating, cast coating, dip coating or the like, and is then dried using an appropriate method. The hole transport layer 103 has the electron blocking effect of suppressing electron leakage from a bulk heterojunction layer 104 to the transparent conductive film 102, and also functions as a buffer layer to smooth the surface roughness of the transparent conductive film 102. The thickness of the hole transport layer 103 is not particularly limited, but is preferably 5 to 100 nm since organic conductive materials have a relatively high electrical resistivity. A thickness less than 5 nm will no longer provide the electron blocking effect or the buffer layer function. A thickness more than 100 nm will probably increase the internal resistance due to the electrical resistance of the hole transport layer 103 itself.

The bulk heterojunction layer 104 is formed adjacent to the hole transport layer 103. In the bulk heterojunction layer, a p-type organic semiconductor material (acceptor) and an n-type organic semiconductor material (donor) coexist in a phase separated mixture. Such a bulk heterojunction layer can be formed by known methods such as by blending p- and n-type semiconductor materials in a solvent followed by application and drying of the blend. The bulk heterojunction layer 104 of the embodiment contains a light-absorbing conjugated polymer and a low-molecular-weight, electron-accepting organic compound molecule. In this embodiment, the inorganic nanoparticles 105 have an uneven concentration distribution in the thickness direction of the bulk heterojunction layer 104.

The conjugated polymer used for the bulk heterojunction layer 104 is not particularly limited as long as it has an absorption band in the visible spectral region. For example, there can be used: polythiophene derivatives such as poly(3-hexylthiophene) (P3HT); poly(phenylene vinylene) derivatives such as poly(2-methoxy-5-(3',7'-dimethyloctyloxy)-1,4-phenylene-vinylene (MDMO-PPV); polyfluorene derivatives such as poly(9,9-dioctylfluorene-2,7-diyl) (PFO); etc.

As the electron-accepting molecule for use in the bulk heterojunction layer 104, for example, fullerene derivatives such as [6,6]-phenyl-$C_{61}$-butyric acid methyl ester (PCBM), perylene derivatives, etc. can be used. Generally, most of such electron-accepting molecules are insoluble, so they may be provided with solubility by introducing a suitable substituent therein.

Adjusted amounts of such a conjugated polymer and such an electron-accepting molecule are dissolved in a solvent (in which both can be solved) to give a desired concentration, thereby preparing a solution of a mixture of the two materials. As the solvent, toluene, chlorobenzene, o-dichlorobenzene, etc. can be used. The mixing ratio of the conjugated polymer and the electron-accepting molecule and the solution concentration are important parameters for specifying the phase separation structure of the bulk heterojunction layer. Therefore, these two factors as well as other factors such as the application conditions must be appropriately chosen to provide the desired properties. The thus obtained solution of the mixture is then applied by a suitable method such as spin coating, dip coating, doctor-blade coating, and is dried to form a film, thereby providing a bulk heterojunction layer. The thickness of the bulk heterojunction 104 is preferably 10 to 100 nm.

As shown in FIG. 1, the organic thin film solar cell according to the present invention contains the inorganic nanoparticles 105 in the bulk heterojunction layer 104. The inorganic nanoparticles 105 have an uneven concentration distribution in the thickness direction of the bulk heterojunction layer 104. In other words, the inorganic nanoparticles 105 are locally more heavily concentrated in a thinner sub-layer of the bulk heterojunction layer 104. Hereinafter, the bulk heterojunction layer 104 and the inorganic nanoparticles 105 are sometimes collectively referred to as the "organic thin film layer 104'".

Materials usable for the inorganic nanoparticles 105 include: metal oxides such as tin (Sn) oxides, titanium oxides and zinc (Zn) oxides; and compound semiconductors of copper, indium and selenium (CIS). The size of the inorganic nanoparticles 105 is not particularly limited, but is preferably several nanometers to several tens of nanometers, which are less than the typical 10 to 100 nm thicknesses of the bulk heterojunction layer 104. Generally, inorganic nanoparticles smaller than this size (several nanometers) are difficult to obtain. Use of inorganic nanoparticles larger than 100 nm in diameter is disadvantageous, because such nanoparticles are larger than the film thickness, causing such problems as film thickness nonuniformity or short circuiting of the cell.

Next, the volume concentration of the inorganic nanoparticles contained in the bulk heterojunction layer will be described. A preferable volume percentage of the inorganic nanoparticles 105 is from 0.1 vol % to 60 vol %. Volume percentages less than 0.1 vol % will result in a decrease in the absolute amount of the inorganic nanoparticles, making the formation of percolation structure (or bead structure) difficult, and will therefore have almost no contribution to increase in charge generation. A volume percentage more than 60 vol % is disadvantageous because it degrades the smoothness of the flat surface of the bulk heterojunction layer 104, causing such problems as short circuiting of the cell.

Figure 11:
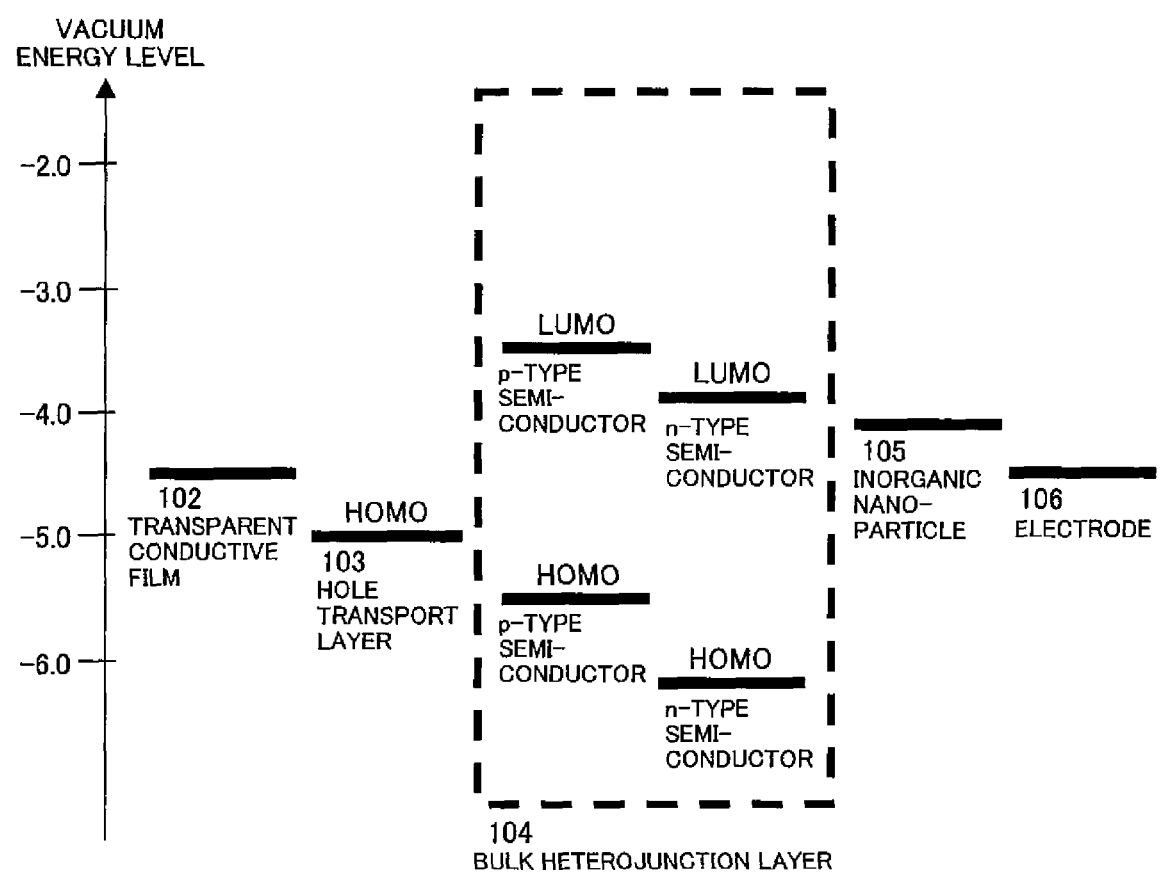
FIG. 11 is a diagram of exemplary energy levels of the component materials of a bulk heterojunction organic thin film solar cell according to the first embodiment of the invention.

The organic thin film solar cell according to the present invention has an uneven concentration distribution of the inorganic nanoparticles 105 in the thickness direction of the bulk heterojunction layer 104. In order to efficiently generate and extract charge by making more efficient use of the electron-accepting properties of the inorganic nanoparticles, it is desirable that the inorganic nanoparticles are locally heavily concentrated near the interface with the electrode. The necessity of providing such an uneven concentration distribution will be described below. FIG. 11 is a diagram of exemplary energy levels (with reference to the vacuum energy level) of the component materials of the bulk heterojunction organic thin film solar cell according to the first embodiment of the invention. As shown in FIG. 11, the energy level of the lowest unoccupied molecular orbital (LUMO) of the electron-accepting molecule of the bulk heterojunction layer 104 is higher than the Fermi level of the inorganic nanoparticles 105. In the bulk heterojunction layer 104, the electron-accepting molecule is the dominant electron carrier and its volume percentage (volume concentration) is larger than that of the inorganic nanoparticles 105. In this case, the energy levels of the inorganic nanoparticles, which are lower than those of the electron-accepting molecule, serve as electron trap. Therefore, a uniform distribution of the inorganic nanoparticles throughout the bulk heterojunction layer will degrade the electron transportability. Hence, the inorganic nanoparticles 105 need to have an uneven concentration distribution in the thickness direction of the bulk heterojunction layer 104 so that they are more heavily concentrated near the interface with the electrode.

Exemplary methods for providing such an uneven concentration distribution of the inorganic nanoparticles 105 (or locally more heavily concentrating them) will be described below. The first method is as follows: First, a dispersion is prepared by dispersing the inorganic nanoparticles in a dispersion medium which cannot dissolve the bulk heterojunction layer 104. Then, the thus prepared dispersion is applied onto the bulk heterojunction layer 104, which is formed on the transparent electrode 111, by spin coating, dip coating, cast coating or the like, so that a thin sub-layer heavily concentrated with the inorganic nanoparticles 105 is formed on the bulk heterojunction layer 104. This method can prevent the underlying bulk heterojunction layer 104 from being eroded by such the dispersion medium. As the disperse medium in which the inorganic nanoparticles are dispersed, alcohol solvents such as ethanol can be used.

The second method is as follows: First, a dispersion is prepared by dispersing the inorganic nanoparticles in a dispersion medium which can dissolve the bulk heterojunction layer 104. Then, similarly to the first method, the thus prepared dispersion is applied onto the bulk heterojunction layer 104 by spin coating, dip coating, cast coating or the like, so that a thin sub-layer heavily concentrated with the inorganic nanoparticles 105 is formed on the bulk heterojunction layer 104. In this method, the surface region of the underlying bulk heterojunction layer 104 is eroded by the dispersion medium containing the inorganic nanoparticles. However, such erosion is accompanied by diffusion of the inorganic nanoparticles into the layer 104, thus providing a more preferable concentration gradient of the inorganic nanoparticles in the film thickness direction.

The third method is as follows: First, a dispersion is prepared by dispersing the inorganic nanoparticles in a solution containing a mixture of the conjugated polymer and the electron-accepting molecule of the bulk heterojunction layer 104. Then, similarly to the first method, the thus prepared dispersion is applied onto the bulk heterojunction layer 104 by spin coating, dip coating, cast coating or the like, so that a thin sub-layer heavily concentrated with the inorganic nanoparticles 105 is formed on the bulk heterojunction layer 104. In this method, similarly to the second method, the surface region of the underlying bulk heterojunction layer 104 is eroded by the dispersion. However, the dispersion contains the same component materials as those of the bulk heterojunction layer; therefore, this method advantageously provides good surface smoothness as well as provision of a preferable concentration gradient of the inorganic nanoparticles in the film thickness direction.

It is appreciated that the methods of the invention for providing an uneven concentration distribution of the inorganic nanoparticles are not limited to the three exemplary methods described above.

An electrode 106 is formed adjacent to the thus formed bulk heterojunction layer 104 containing the inorganic nanoparticles. The electrode material is not particularly limited as long as its work function is less than that of the transparent conductive film 102. For example, metallic materials such as aluminum and silver-magnesium (Ag—Mg) alloys can be used. Electrodes of such materials can be readily formed by vapor deposition or the like.

Preferably, a hole blocking layer 107 for suppressing leakage of hole current is sandwiched between the bulk heterojunction layer 104 and the electrode 106. Such provision of the hole blocking layer 107 can improve the rectifying properties of the diode function of the bulk heterojunction organic thin film solar cell. As the hole blocking layer, for example, a lithium fluoride (LiF) thin film can be used. In this case, the film thickness is preferably from several angstroms to several tens of angstroms.

Improvement of First Embodiment

Inversion of Electrode Arrangement

Figure 2:
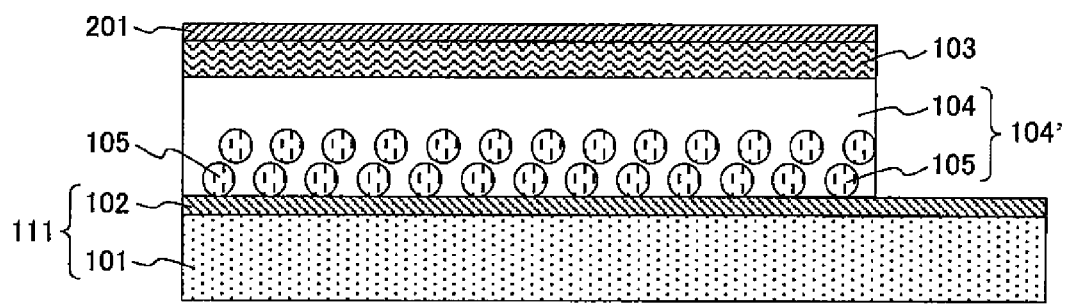
FIG. 2 is a schematic cross-sectional view illustrating a principal structure of a bulk heterojunction organic thin film solar cell according to an improvement of the first embodiment of the invention.

In the above-described bulk heterojunction organic thin film solar cell according to the first embodiment, the transparent electrode functions as a positive electrode and the metal electrode functions as a negative electrode. However, an arrangement in which the metal electrode functions as a positive electrode and the transparent electrode functions as a negative electrode is also possible. FIG. 2 is a schematic cross-sectional view illustrating a principal structure of a bulk heterojunction organic thin film solar cell according to an improvement of the first embodiment of the invention, which has such an inverted electrode arrangement.

As shown in FIG. 2, a bulk heterojunction layer 104 (organic thin film layer 104') is formed adjacent to a transparent electrode 111. In this case, inorganic nanoparticles 105 are locally heavily concentrated near the interface with a transparent conductive film 102. In other words, the inorganic nanoparticles 105 have a concentration gradient in the thickness direction of the organic thin film layer 104'. This configuration can also be formed, for example, by methods generally similar to the aforementioned first to third methods. However, a method generally similar to the aforementioned third method (which can improve adhesiveness between the bulk heterojunction layer 104 and the inorganic nanoparticles 105) is most preferable in view of adhesiveness between the transparent conductive film 102 and the organic thin film layer 104' (the bulk heterojunction layer 104+the inorganic nanoparticles 105).

Adjacent to the thus prepared bulk heterojunction layer 104 is formed a hole transport layer 103. The hole transport layer 103 can be made of, for example, PEDOT-PSS and can be formed by spin coating, cast coating, dip coating or the like.

Adjacent to the hole transport layer 103 is formed an electrode 201. The material usable for the electrode 201 is not particularly limited as long as its work function is larger than that of the transparent conductive film 102 and smaller than the difference between the highest occupied molecular orbital of the hole transport layer 103 and the vacuum energy level. For example, metals such as gold (Au) can be used. Such an electrode can be readily formed by vapor deposition or the like.

Second Embodiment

Bulk Heterojunction Organic Thin Film Solar Cell Having Amorphous Inorganic Thin Film In a second embodiment of the present invention, an amorphous inorganic thin film is used as the hole blocking layer 107 of the bulk heterojunction organic thin film solar cell according to the first embodiment. As described, in the first embodiment, the bulk heterojunction layer 104 (organic thin film layer 104') having an uneven concentration distribution of the inorganic nanoparticles 105 is in contact with a lithium fluoride ultrathin film functioning as the hole blocking layer 107. In such a case, when the electrode 106 is formed, it can suffer from formation of pinholes or the like due to the surface roughness caused by the inorganic nanoparticles 105.

Figure 3:
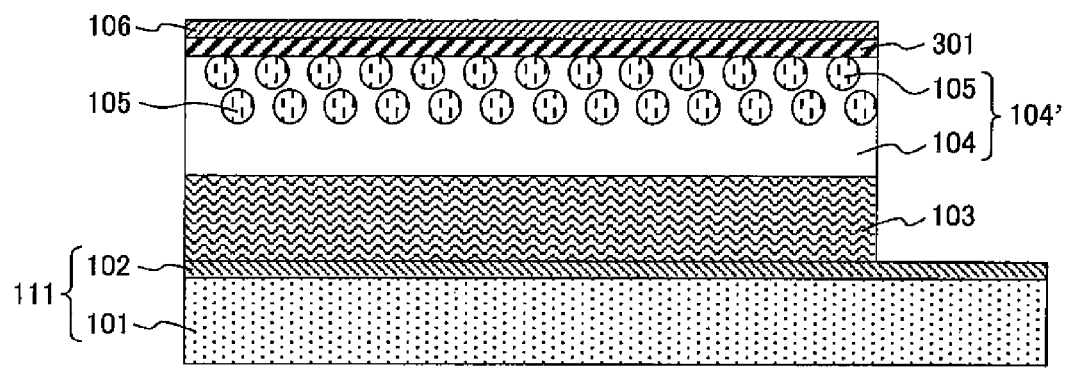
FIG. 3 is a schematic cross-sectional view illustrating a principal structure of a bulk heterojunction organic thin film solar cell according to a second embodiment of the invention.

In order to prevent such a problem, the second embodiment uses, as the hole blocking layer, an amorphous thin film containing some of the constituent elements of the inorganic nanoparticles 105. This structure can achieve better adhesiveness between the layer of the inorganic nanoparticles of the bulk heterojunction layer (organic thin film layer) and the amorphous inorganic thin film, and can achieve better interface smoothness between the hole blocking layer and the electrode. FIG. 3 is a schematic cross-sectional view illustrating a principal structure of a bulk heterojunction organic thin film solar cell thus prepared according to the second embodiment of the invention.

As described above, the amorphous inorganic thin film 301 preferably contains some of the constituent elements of the inorganic nanoparticles 105 contained in the bulk heterojunction layer 104 (organic thin film layer 104'). This structure provides a relatively low energy barrier over which charges generated in the inorganic nanoparticles 105 can be transported to the amorphous inorganic thin film 301.

There is no particular limitation on the method for forming the amorphous inorganic thin film 301. For example, there is prepared a sol having, as its main component, a metal alkoxide containing some of the constituent elements of the inorganic nanoparticles 105. Then, the sol is applied by spin coating, dip coating, cast coating or the like, followed by heating and drying for polymerization (gelation), thereby forming the amorphous inorganic thin film 301. The amorphous inorganic thin film 301 can be also readily formed by, e.g., ion beam deposition of its components.

The thickness of the amorphous inorganic thin film 301 is not particularly limited so long as it does not degrade charge transportability, but is preferably from several nanometers to several tens of nanometers. A thickness less than 1 nm will perform little hole blocking function, thus reducing the photoelectric conversion efficiency of the solar cell. A thickness more than 100 nm will increase the internal resistance of the solar cell, thus significantly degrading the photoelectric conversion efficiency.

Improvement of Second Embodiment

Inversion of Electrode Arrangement

Figure 4:
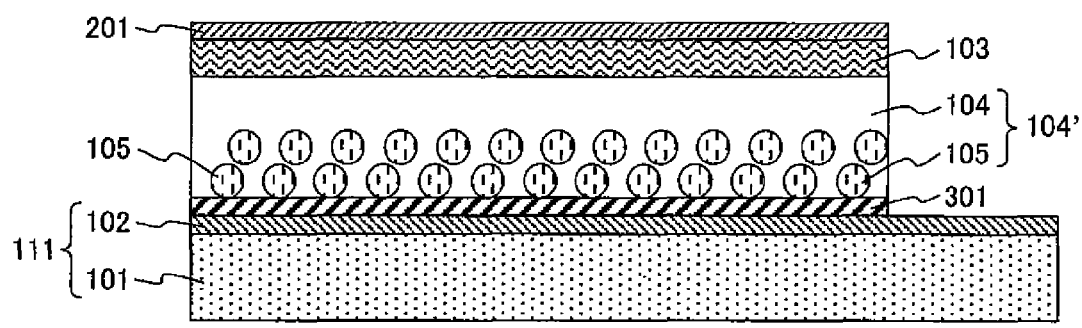
FIG. 4 is a schematic cross-sectional view illustrating a principal structure of a bulk heterojunction organic thin film solar cell according to an improvement of the second embodiment of the invention.

Similarly to the improvement of the first embodiment, an improvement of the second embodiment can also have an arrangement in which the transparent conductive film functions as a negative electrode and the metal electrode functions as a positive electrode. FIG. 4 is a schematic cross-sectional view illustrating a principal structure of a bulk heterojunction organic thin film solar cell according to the improvement of the second embodiment of the invention.

As shown in FIG. 4, an amorphous inorganic thin film 301 is formed on a transparent conductive film 102. The amorphous inorganic thin film 301 can be readily formed, for example, by application and polymerization of a sol containing such a metal alkoxide as described in the second embodiment, or by ion beam deposition using the components of the amorphous inorganic material as the targets.

Adjacent to the amorphous inorganic thin film 301 is formed a bulk heterojunction layer 104 (organic thin film layer 104') having an uneven concentration distribution of inorganic nanoparticles 105. Similarly to the improvement of the first embodiment, a preferred method for forming such layers is as follows: First, a dispersion is prepared by dispersing the inorganic nanoparticles in a solution containing a mixture of the conjugated polymer and the electron-accepting molecule of the bulk heterojunction layer. Next, the thus prepared dispersion is applied onto the amorphous inorganic thin film 301 by spin coating, dip coating, cast coating or the like to form a layer containing the inorganic nanoparticles 105. Then, the bulk heterojunction layer 104 is formed on the layer containing the inorganic nanoparticles 105. The other configurations of the improvement of the second embodiment are similar to those of the improvement of the first embodiment.

Third Embodiment

Formation of Bulk Heterojunction Layer by Codeposition of Low-Molecular-Weight Dye Compound and Electron-Accepting Molecule In the first and second embodiments, the bulk heterojunction layer 104 includes a conjugated polymer and a low-molecular-weight, electron-accepting organic compound molecule. It is generally known that the bulk heterojunction layer can be also formed by a codeposition method in which a light-absorbing molecule and an electron-accepting molecule, which are placed in two different boats, are simultaneously vapor deposited onto a substrate. In organic thin film solar cells according to the present invention, the bulk heterojunction layer can be also formed by codeposition.

Figure 5:
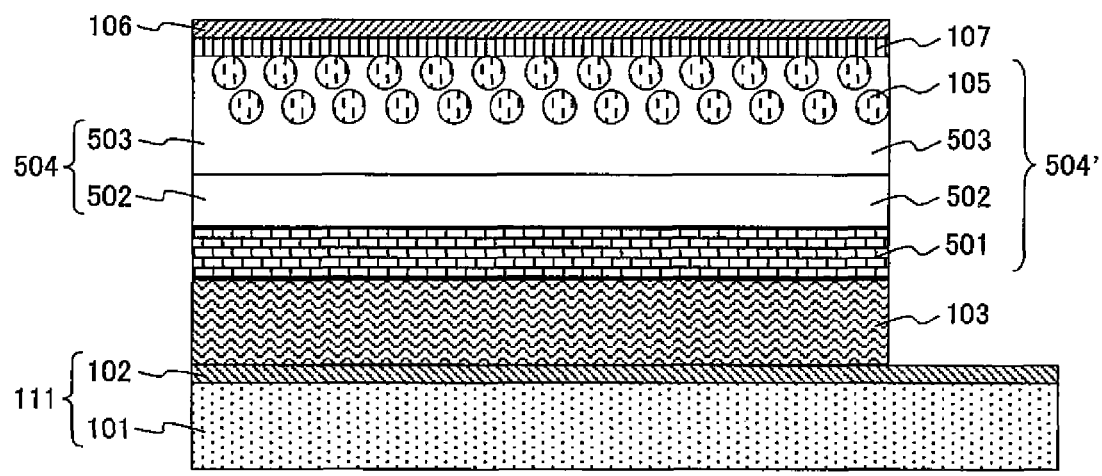
FIG. 5 is a schematic cross-sectional view illustrating a principal structure of a bulk heterojunction organic thin film solar cell according to a third embodiment of the invention.

FIG. 5 is a schematic cross-sectional view illustrating a principal structure of a bulk heterojunction organic thin film solar cell thus prepared according to the third embodiment of the invention. As shown in FIG. 5, a hole transport layer 103 is formed adjacent to a transparent conductive film 102. The hole transport layer 103 can be formed by using the same materials and conditions as those used in the first and second embodiments.

On this layer 103 is formed a light-absorbing low-molecular-weight dye layer 501 by vapor deposition. Materials usable for the low-molecular-weight dye layer 501 include: copper phthalocyanines; metalloporphyrins and derivatives thereof; cyanine dyes; quinone dyes such as benzoquinons and naphthoquinones; and polyacene derivatives such as pentacenes. The dye compound molecules in the low-molecular-weight dye layer 501 absorb light and become exited. Thereafter, they need to diffuse into a codeposited layer 502 for charge separation. In order to satisfy the conditions under which the excited dye compound molecules can diffuse while maintaining their exited states, the thickness of the light-absorbing low-molecular-weight dye layer 501 is preferably less than 100 nm. A thickness more than this value will exceed the maximum diffusion lengths of such excited dye compound molecules and will perform little charge separation function.

Adjacent to the low-molecular-weight dye layer 501 is formed the codeposited layer 502 containing the light-absorbing low-molecular-weight dye compound and the electron-accepting molecule. The codeposited layer 502 is formed as follows: The low-molecular-weight dye and the electron-accepting molecules are placed in two different boats and then a codeposition is carried out in such a condition as to give a desired mixture ratio of both materials. The thickness of the codeposited layer 502 is typically chosen to be several nanometers to several hundreds of nanometers, but is preferably from 10 nanometers to 100 nanometers in view of the diffusion lengths of the excited low-molecular-weight dye compound molecules as well as the diffusion lengths of charges generated.

Adjacent to the codeposited layer 502 is formed a mixed layer 503 of the electron-accepting molecule and inorganic nanoparticles 105. Similarly to the first embodiment, the mixed layer 503 can be formed as follows: First, a dispersion is prepared by dispersing the inorganic nanoparticles in a solution of an electron-accepting molecule (e.g., PCBM) soluble in an organic solvent. Then, the dispersion is applied by spin coating, cast coating, dip coating or the like, and the mixed layer 503 is formed. With this method, the mixed layer 503 and the codeposited layer 502, at their interface, erode each other and mingle with each other, thereby providing a bulk heterojunction layer 504 having an uneven concentration distribution of the inorganic nanoparticles 105 along the film thickness. In other words, the inorganic nanoparticles 105 are locally heavily concentrated in a thinner sub-layer of the bulk heterojunction layer 504. With this formation method, for such a bulk heterojunction layer 504 using a low-molecular-weight dye compound, an uneven concentration distribution of inorganic nanoparticles along the film thickness can be also achieved. Hereinafter, the low-molecular-weight dye layer 501, the bulk heterojunction layer 504 and the thin sub-layer heavily concentrated with the inorganic nanoparticles 105 are sometimes collectively referred to as an "organic thin film layer 504'".

Similarly to the first embodiment, a hole blocking layer 107 and an electrode 106 are formed on the thus prepared bulk heterojunction layer 504 (organic thin film layer 504'). For example, lithium fluoride can be used for the hole blocking layer 107. In addition, the electrode 106 can function as a negative electrode by using an electrode material such as aluminum or silver-magnesium alloys.

Improvement of Third Embodiment

Inversion of Electrode Arrangement

Figure 6:
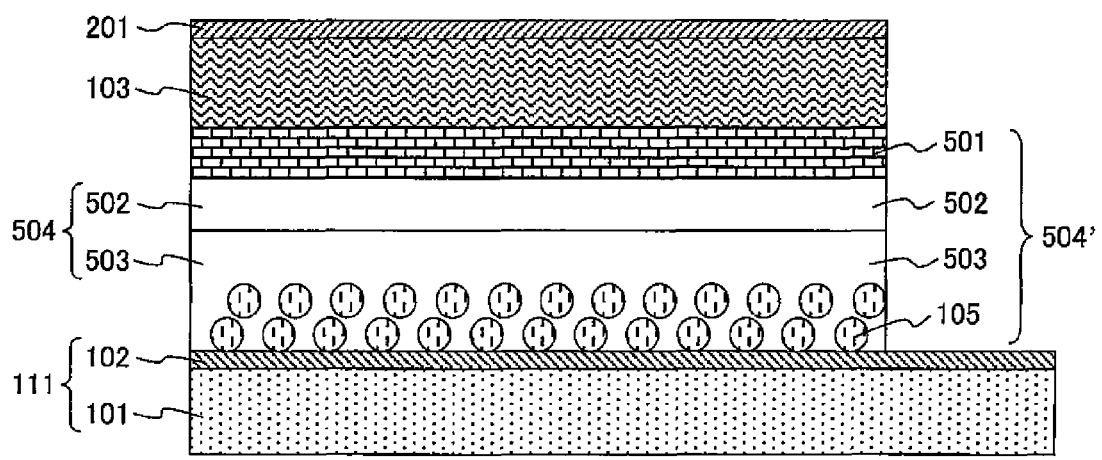
FIG. 6 is a schematic cross-sectional view illustrating a principal structure of a bulk heterojunction organic thin film solar cell according to an improvement of the third embodiment of the invention.

FIG. 6 is a schematic cross-sectional view illustrating a principal structure of a bulk heterojunction organic thin film solar cell according to an improvement of the third embodiment of the invention. The improvement of the third embodiment has an arrangement in which the transparent conductive film 102 functions as a negative electrode and the electrode 201 functions as a positive electrode. In this case, the electrode 201 can be formed, for example, by vapor depositing a material such as gold. The other layers, such as the organic thin film layer 504' (including the inorganic nanoparticles 105, the bulk heterojunction layer 504 and the low-molecular-weight dye layer 501) and the hole transport layer 103, can be formed by using forming conditions similar to those used in the third embodiment.

Fourth Embodiment

Bulk Heterojunction Organic Thin Film Solar Cell Having Amorphous Inorganic Thin Film and Codeposited Layer of Low-Molecular-Weight Dye Compound and Electron-Accepting Molecule In the above third embodiment, similarly to the first embodiment, when a solution of a mixture of the electron-accepting molecule and the inorganic nanoparticles is applied onto the codeposited layer by a method such as used in the third embodiment, the resulting surface can have a roughness due to agglomeration of the inorganic nanoparticles 105 or other causes. Such a surface roughness can form pinholes in the overlying electrode 106. And, such pinholes are undesirable because they can cause short-circuiting of the cell.

Figure 7:
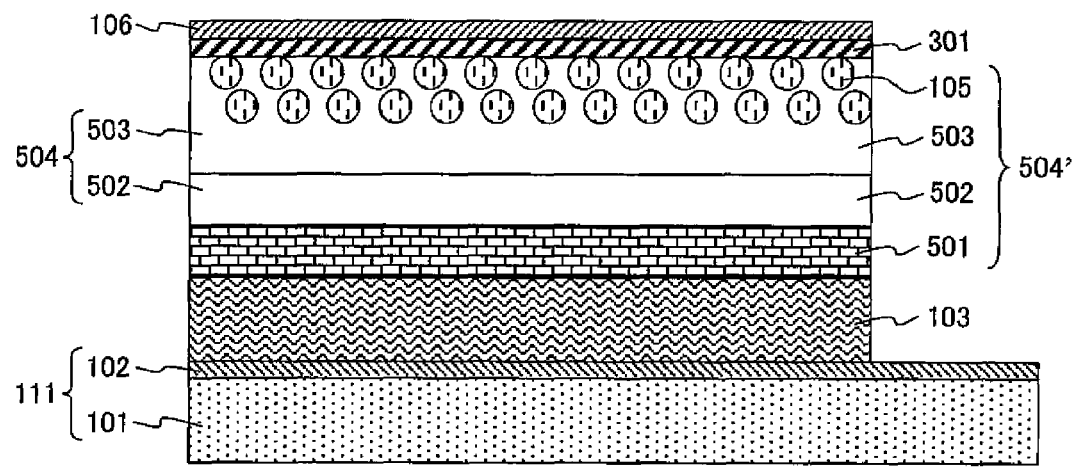
FIG. 7 is a schematic cross-sectional view illustrating a principal structure of a bulk heterojunction organic thin film solar cell according to a fourth embodiment of the invention.

To prevent such a problem, a fourth embodiment forms an amorphous inorganic thin film 301 sandwiched between the bulk heterojunction layer 504 having an uneven concentration distribution of the inorganic nanoparticles 105 and the electrode 106. FIG. 7 is a schematic cross-sectional view illustrating a principal structure of a bulk heterojunction organic thin film solar cell which includes an amorphous inorganic thin film thus prepared according to a fourth embodiment of the invention.

Similarly to the second embodiment, the amorphous inorganic thin film 301 preferably contains some of the constituent elements of the inorganic nanoparticles 105 contained in the bulk heterojunction layer 504. This structure provides a relatively low energy barrier over which charges generated in the inorganic nanoparticles can be transported to the amorphous inorganic thin film 301.

There is no particular limitation on the method for forming the amorphous inorganic thin film 301. For example, there is prepared a sol having, as its main component, a metal alkoxide containing some of the constituent elements of the inorganic nanoparticles 105. Then, the sol is applied onto the bulk heterojunction layer by spin coating, dip coating, cast coating or the like, followed by heating and drying for polymerization (gelation), thereby forming the amorphous inorganic thin film 301. The amorphous inorganic thin film 301 can be also readily formed by, e.g., ion beam deposition of its components.

The thickness of the amorphous inorganic thin film 301 is not particularly limited so long as it does not degrade charge transportability, but is preferably from several nanometers to several tens of nanometers. A thickness less than 1 nm will perform little hole blocking function, thus reducing the photoelectric conversion efficiency of the solar cell. A thickness more than 100 nm will increase the internal series resistance of the solar cell, thus significantly degrading the photoelectric conversion efficiency.

Improvement of Fourth Embodiment

Inversion of Electrode Arrangement

Figure 8:
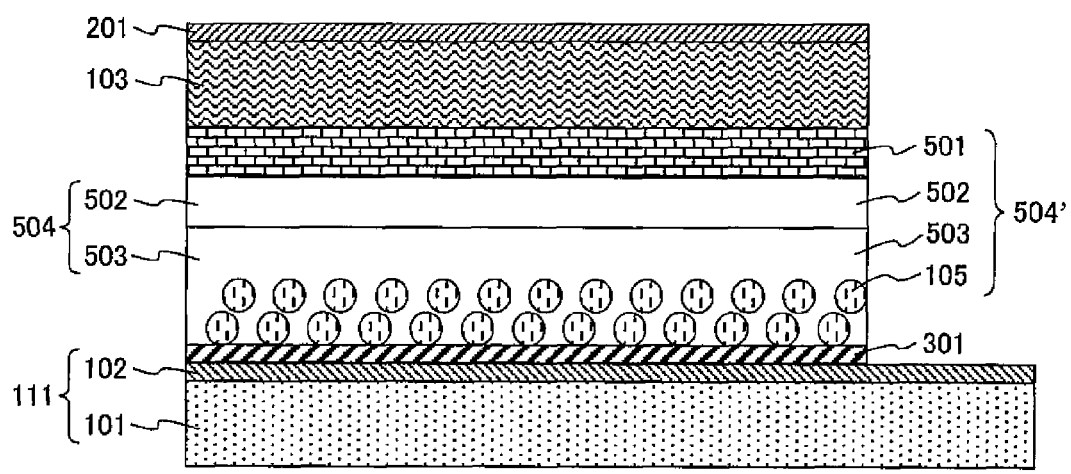
FIG. 8 is a schematic cross-sectional view illustrating a principal structure of a bulk heterojunction organic thin film solar cell according to an improvement of the fourth embodiment of the invention.
Figure 9:
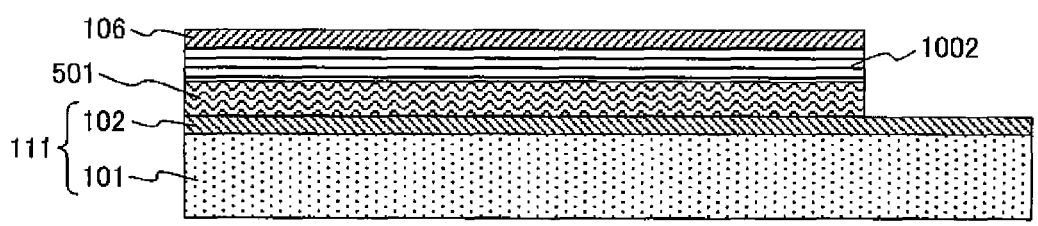
FIG. 9 is a schematic cross-sectional view illustrating a principal structure of a planar heterojunction organic thin film solar cell.
Figure 10:
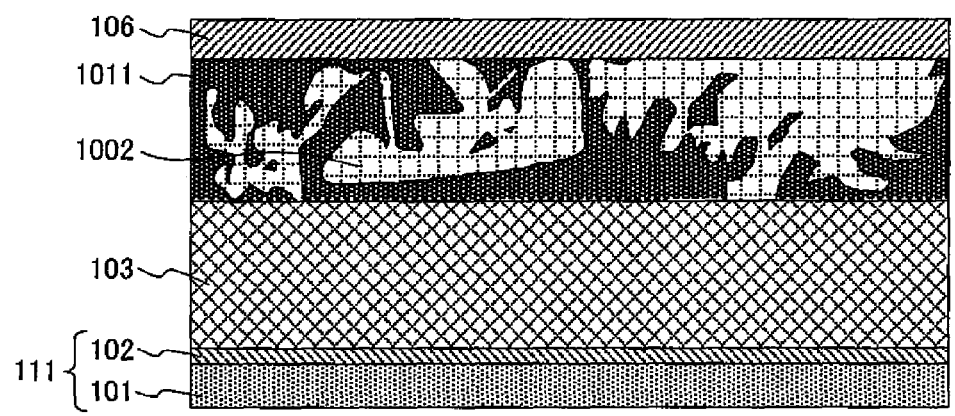
FIG. 10 is a schematic cross-sectional view illustrating a principal structure of a bulk heterojunction organic thin film solar cell.

Similarly to the improvement of the second embodiment, an improvement of the fourth embodiment can also have an arrangement in which the transparent conductive film 102 functions as a negative electrode and the electrode 201 functions as a positive electrode. FIG. 8 is a schematic cross-sectional view illustrating a principal structure of a bulk heterojunction organic thin film solar cell according to the improvement of the fourth embodiment of the invention. By using a method such as those methods described in the first to fourth embodiments, there can be achieved a bulk heterojunction organic thin film solar cell in which the bulk heterojunction layer has an uneven concentration distribution of inorganic nanoparticles along the film thickness.

In order to confirm the effectiveness of the present invention, results of practicing the invention will be described in detail below. It is to be appreciated that methods for confirming the effectiveness of the invention are not limited to the examples below.

Example 1

The bulk heterojunction organic thin film solar cell of Example 1 was fabricated according to the first embodiment as described below. A 30-mm-square transparent electrode formed by sputtering ITO onto a 0.7-mm-thick soda-lime glass was obtained from Nippon Sheet Glass Company, Ltd. The transparent electrode was ultrasonically washed in acetone (for 10 min) and ethanol (for 10 min), and was then dried by air-blowing.

Onto the transparent electrode was applied PEDOT-PSS (Aldrich Chemical) by spin coating to form a hole transport layer. Then, in order to form a bulk heterojunction layer, on the hole transport layer was applied, by spin coating, a chlorobenzene solution of a 1:1 weight ratio mixture of P3HT/PCBM, followed by drying in a constant temperature vacuum bath (at 80° C.) for 60 min.

Next, a dispersion was prepared by dispersing 2 wt % titanium oxide nanoparticles (having a primary particle diameter of 15 nm) in a chlorobenzene solution of a 1:1 weight ratio mixture of P3HT/PCBM. Subsequently, the dispersion was applied onto the bulk heterojunction layer, and was dried in a constant temperature vacuum bath (at 80° C.) for 60 min, thereby forming a thin sub-layer heavily concentrated with the inorganic nanoparticles. Then, on the thin sub-layer of the inorganic nanoparticles were vapor deposited a 0.5-nm-thick layer of lithium fluoride (obtained from Kojundo Chemical Lab) and a subsequent 200-nm-thick layer of aluminum, thereby completing the fabrication of the bulk heterojunction organic thin film solar cell of Example 1.

Example 2

The bulk heterojunction organic thin film solar cell of Example 2 was fabricated similarly to Example 1 except that the primary particle diameter of the titanium oxide nanoparticles was 100 nm.

Example 3

The bulk heterojunction organic thin film solar cell of Example 3 was fabricated according to the first embodiment as described below. A 30-mm-square transparent electrode formed by sputtering ITO onto a 0.7-mm-thick soda-lime glass was obtained from Nippon Sheet Glass Company, Ltd. The transparent electrode was ultrasonically washed in acetone (for 10 min) and ethanol (for 10 min), and was then dried by air-blowing.

Onto the transparent electrode was applied PEDOT-PSS (Aldrich Chemical) by spin coating to form a hole transport layer. Then, in order to form a bulk heterojunction layer, on the hole transport layer was applied, by spin coating, a chlorobenzene solution of a 1:1 weight ratio mixture of P3HT/PCBM, followed by drying in a constant temperature vacuum bath (at 80° C.) for 60 min.

Next, there was prepared an ethanol dispersion of 2 wt % titanium oxide nanoparticles (having a primary particle diameter of 15 nm). Subsequently, the ethanol dispersion was applied onto the bulk heterojunction layer by spin coating and dried, thereby forming a thin sub-layer heavily concentrated with the inorganic nanoparticles. Then, similarly to Example 1, layers of lithium fluoride and aluminum were vapor deposited on the thin sub-layer of the inorganic nanoparticles.

Example 4

The bulk heterojunction organic thin film solar cell of Example 4 was fabricated similarly to Example 3 except that the titanium oxide nanoparticles were dispersed in chlorobenzene instead of in ethanol.

Example 5

The bulk heterojunction organic thin film solar cell of Example 5 was fabricated according to the second embodiment as described below. A 30-mm-square transparent electrode formed by sputtering ITO onto a 0.7-mm-thick soda-lime glass was obtained from Nippon Sheet Glass Company, Ltd. The transparent electrode was ultrasonically washed in acetone (for 10 min) and ethanol (for 10 min), and was then dried by air-blowing.

Onto the transparent electrode was applied PEDOT-PSS (Aldrich Chemical) by spin coating to form a hole transport layer. Then, in order to form a bulk heterojunction layer, on the hole transport layer was applied, by spin coating, a chlorobenzene solution of a 1:1 weight ratio mixture of P3HT/PCBM, followed by drying in a constant temperature vacuum bath (at 80° C.) for 60 min.

Next, a dispersion was prepared by dispersing 2 wt % titanium oxide nanoparticles (having a primary particle diameter of 15 nm) in a chlorobenzene solution of a 1:1 weight ratio mixture of P3HT/PCBM. Subsequently, the dispersion was applied onto the bulk heterojunction layer, and was dried in a constant temperature vacuum bath (at 80° C.) for 60 min, thereby forming a thin sub-layer heavily concentrated with the inorganic nanoparticles. Then, a sol was prepared by mixing 10 ml of titanium isopropoxide (Tokyo Chemical Industry, Co., Ltd.), 50 ml of 2-methoxyethanol and 5 ml of ethanolamine and aging the mixture liquid at 80° C. for 2 h. Subsequently, the sol was applied onto the thin sub-layer of the inorganic nanoparticles by spin coating and was heat treated at 150° C. for 10 min to form an amorphous inorganic thin film. Finally, a 200-nm-thick aluminum was vapor deposited onto the amorphous film to complete the fabrication of the bulk heterojunction organic thin film solar cell of Example 5.

Example 6

The bulk heterojunction organic thin film solar cell of Example 6 was fabricated according to the third embodiment as described below. A 30-mm-square transparent electrode formed by sputtering ITO onto a 0.7-mm-thick soda-lime glass was obtained from Nippon Sheet Glass Company, Ltd. The transparent electrode was ultrasonically washed in acetone (for 10 min) and ethanol (for 10 min), and was then dried by air-blowing.

Onto the transparent electrode was applied PEDOT-PSS (Aldrich Chemical) by spin coating to form a hole transport layer. Then, on the hole transport layer was vapor deposited copper phthalocyanine (Aldrich Chemical) to form a 15-nm-thick low-molecular-weight dye layer. Subsequently, on the dye layer were codeposited copper phthalocyanine and PCBM to form a 30-nm-thick codeposited layer. Next, a dispersion was prepared by dispersing 2 wt % titanium oxide nanoparticles (having a primary particle diameter of 15 nm) in a chlorobenzene solution containing 5 wt % PCBM. Then, the dispersion was applied onto the codeposited layer by spin coating to form a mixed layer. On the mixed layer were then vapor deposited a 5-nm-thick lithium fluoride layer and a 200-nm-thick aluminum layer in this order, thereby completing the fabrication of the bulk heterojunction organic thin film solar cell of Example 6.

Example 7

The bulk heterojunction organic thin film solar cell of Example 7 was fabricated according to the fourth embodiment as described below. In the same manner as used in Example 6, Example 7 performed all the fabrication steps up to the step of forming a mixed-layer (i.e., the step of preparing a dispersion by dispersing 2 wt % titanium oxide nanoparticles having a primary particle diameter of 15 nm in a chlorobenzene solution containing 5 wt % PCBM and applying the dispersion by spin coating). Then, a sol was prepared by mixing 10 ml of titanium isopropoxide (Tokyo Chemical Industry, Co., Ltd.), 50 ml of 2-methoxyethanol and 5 ml of ethanolamine and aging the mixture liquid at 80° C. for 2 h. Subsequently, the sol was applied onto the mixed-layer by spin coating and was dried at 150° C. for 10 min to form an amorphous inorganic thin film. Finally, a 200-nm-thick aluminum was vapor deposited onto the amorphous film to complete the fabrication of the bulk heterojunction organic thin film solar cell of Example 7.

Comparative Example 1

The bulk heterojunction organic thin film solar cell of Comparative Example 1 was fabricated as described below. Similarly to Example 1, a 30-mm-square transparent electrode formed by sputtering ITO onto a 0.7-mm-thick soda-lime glass was obtained from Nippon Sheet Glass Company, Ltd. The transparent electrode was ultrasonically washed in acetone (for 10 min) and ethanol (for 10 min), and was then dried by air-blowing.

Onto the transparent electrode was applied PEDOT-PSS (Aldrich Chemical) by spin coating to form a hole transport layer. Then, in order to form a bulk heterojunction layer, on the hole transport layer was applied, by spin coating, a chlorobenzene solution of a 1:1 weight ratio mixture of P3HT/PCBM, followed by drying in a constant temperature vacuum bath (at 80° C.) for 60 min. On the bulk heterojunction layer were then vapor deposited a 5-nm-thick lithium fluoride layer and a 200-nm-thick aluminum layer in this order, thereby completing the fabrication of the bulk heterojunction organic thin film solar cell of Comparative Example 1 which did not contain titanium oxide nanoparticles unlike Example 1.

Comparative Example 2

The bulk heterojunction organic thin film solar cell of Comparative Example 2 was fabricated as described below. Similarly to Example 1, a 30-mm-square transparent electrode formed by sputtering ITO onto a 0.7-mm-thick soda-lime glass was obtained from Nippon Sheet Glass Company, Ltd. The transparent electrode was ultrasonically washed in acetone (for 10 min) and ethanol (for 10 min), and was then dried by air-blowing.

Onto the transparent electrode was applied PEDOT-PSS (Aldrich Chemical) by spin coating to form a hole transport layer. Next, a dispersion was prepared by dispersing 2 wt % titanium oxide nanoparticles (having a primary particle diameter of 15 nm) in a chlorobenzene solution of a 1:1 weight ratio mixture of P3HT/PCBM. Subsequently, the dispersion was applied onto the hole transport layer, and was dried in a constant temperature vacuum bath (at 80° C.) for 60 min, thereby forming a bulk heterojunction layer. On the bulk heterojunction layer were then vapor deposited a 5-nm-thick layer of lithium fluoride (obtained by Kojundo Chemical Lab) and a 200-nm-thick aluminum layer, thereby completing the fabrication of the bulk heterojunction organic thin film solar cell of Comparative Example 2. In Comparative Example 2, the titanium oxide nanoparticles are uniformly dispersed throughout the thickness of the bulk heterojunction layer.

Comparative Example 3

The bulk heterojunction organic thin film solar cell of Comparative Example 3 was fabricated in the manner described below. Similarly to Example 5, a 30-mm-square transparent electrode formed by sputtering ITO onto a 0.7-mm-thick soda-lime glass was obtained from Nippon Sheet Glass Company, Ltd. The transparent electrode was ultrasonically washed in acetone (for 10 min) and ethanol (for 10 min), and was then dried by air-blowing.

Onto the transparent electrode was applied PEDOT-PSS (Aldrich Chemical) by spin coating to form a hole transport layer. Then, in order to form a bulk heterojunction layer, on the hole transport layer was applied, by spin coating, a chlorobenzene solution of a 1:1 weight ratio mixture of P3HT/PCBM, followed by drying in a constant temperature vacuum bath (at 80° C.) for 60 min. Then, a sol was prepared by mixing 10 ml of titanium isopropoxide (Tokyo Chemical Industry, Co., Ltd.), 50 ml of 2-methoxyethanol and 5 ml of ethanolamine and aging the mixture liquid at 80° C. for 2 h. Subsequently, the sol was applied onto the bulk heterojunction layer by spin coating and was dried at 150° C. for 10 min to form an amorphous inorganic thin film. On the amorphous inorganic thin film was then vapor deposited a 200-nm-thick aluminum layer, thereby completing the fabrication of the bulk heterojunction organic thin film solar cell of Comparative Example 3 which did not contain titanium oxide nanoparticles.

Comparative Example 4

The bulk heterojunction organic thin film solar cell of Comparative Example 4 was fabricated in the manner described below. Similarly to Example 6, a 30-mm-square transparent electrode formed by sputtering ITO onto a 0.7-mm-thick soda-lime glass was obtained from Nippon Sheet Glass Company, Ltd. The transparent electrode was ultrasonically washed in acetone (for 10 min) and ethanol (for 10 min), and was then dried by air-blowing.

Onto the transparent electrode was applied PEDOT-PSS (Aldrich Chemical) by spin coating to form a hole transport layer. Then, on the hole transport layer was vapor deposited copper phthalocyanine (Aldrich Chemical) to form a 15-nm-thick low-molecular-weight dye layer. Subsequently, on the dye layer were codeposited copper phthalocyanine and PCBM to form a 30-nm-thick codeposited layer. Next, onto the codeposited layer was applied a chlorobenzene solution containing 5 wt % PCBM by spin coating to form a layer of an electron-accepting molecule. On this layer were then vapor deposited a 5-nm-thick lithium fluoride layer and a 200-nm-thick aluminum layer in this order, thereby completing the fabrication of the bulk heterojunction organic thin film solar cell of Comparative Example 4 which did not contain titanium oxide nanoparticles.

Comparative Example 5

The bulk heterojunction organic thin film solar cell of Comparative Example 5 was fabricated in the manner described below. In the same manner as used in Example 6, Comparative Example 5 performed all the fabrication steps up to the step of forming low-molecular-weight dye and codeposited layers (i.e., the step of vapor depositing, on the hole transport layer, copper phthalocyanine (Aldrich Chemical) to form a 15-nm-thick low-molecular-weight dye layer and subsequently codepositing copper phthalocyanine and PCBM to form a 30-nm-thick codeposited layer). Then, a sol was prepared by mixing 10 ml of titanium isopropoxide (Tokyo Chemical Industry, Co., Ltd.), 50 ml of 2-methoxyethanol and 5 ml of ethanolamine and aging the mixture liquid at 80° C. for 2 h. Subsequently, the sol was applied onto the codeposited layer by spin coating and was dried at 150° C. for 10 min to form an amorphous inorganic thin film. On the amorphous inorganic thin film was then vapor deposited a 200-nm-thick aluminum layer, thereby completing the fabrication of the bulk heterojunction organic thin film solar cell of Comparative Example 5 which did not contain titanium oxide nanoparticles unlike Example 7.

(Evaluation Method)

The thus obtained bulk heterojunction organic thin film solar cells (Examples 1 to 7 and Comparative Examples 1 to 5) were connected to a current-voltage measuring instrument and were measured for the voltage-current density characteristics of the photovoltaic generation. A solar simulator was used as light source and each sample was irradiated with a simulated solar irradiation of AM1.5 (=1 Sun or 100 mW/cm$^2$) through the window electrode.

(Measurement Result)

(Measurement Result of Example 1)

The above-described current-voltage measurement for the Example 1 bulk heterojunction organic thin film solar cell showed that the short-circuit current density was 10.5 mA/cm$^2$, the open-circuit voltage was 0.5 V, the fill factor was 0.68 and the photoelectric conversion efficiency was 3.6%.

(Measurement Result of Example 2)

The above-described current-voltage measurement for the Example 2 bulk heterojunction organic thin film solar cell showed that the short-circuit current density was 8.5 mA/cm$^2$, the open-circuit voltage was 0.35 V, the fill factor was 0.40 and the photoelectric conversion efficiency was 1.2%.

(Measurement Result of Example 3)

The above-described current-voltage measurement for the Example 3 bulk heterojunction organic thin film solar cell showed that the short-circuit current density was 8.7 mA/cm$^2$, the open-circuit voltage was 0.5 V, the fill factor was 0.60 and the photoelectric conversion efficiency was 2.6%.

(Measurement Result of Example 4)

The above-described current-voltage measurement for the Example 4 bulk heterojunction organic thin film solar cell showed that the short-circuit current density was 9.0 mA/cm$^2$, the open-circuit voltage was 0.5 V, the fill factor was 0.68 and the photoelectric conversion efficiency was 3.1%.

(Measurement Result of Comparative Example 1)

The above-described current-voltage measurement for the Comparative Example 1 bulk heterojunction organic thin film solar cell showed that the short-circuit current density was 6.7 mA/cm$^2$, the open-circuit voltage was 0.5 V, the fill factor was 0.60 and the photoelectric conversion efficiency was 2.0%.

(Measurement Result of Comparative Example 2)

The above-described current-voltage measurement for the Comparative Example 2 bulk heterojunction organic thin film solar cell showed that the short-circuit current density was 7.5 mA/cm$^2$, the open-circuit voltage was 0.4 V, the fill factor was 0.50 and the photoelectric conversion efficiency was 1.5%.

(Effectiveness of Invention Confirmed by Measurement Results)

The measurement results of Examples 1 to 4 and Comparative Examples 1 to 2 show the following: The solar cells of Examples 1, 3 and 4 (which have an uneven concentration distribution of titanium oxide nanoparticles [inorganic nanoparticles] in the thickness direction of the organic thin film layer) have a short-circuit current density larger than the solar cell of Comparative Example 1 which does not contain such inorganic nanoparticles. Such increases in the short-circuit current density probably result from an improvement in the electron-accepting properties. Thus, it is confirmed that such inclusion of inorganic nanoparticles contributes to an improvement in the efficiency of a bulk heterojunction organic thin film solar cell.

Also, Example 1 of the invention exhibits a greater short-circuit current density and a higher open-circuit voltage than Comparative Example 2 in which the inorganic nanoparticles are uniformly dispersed. This result shows that in the invention it is more advantageous that the inorganic nanoparticles has an uneven concentration distribution in the thickness direction of the organic thin film layer (i.e., the inorganic nanoparticles are locally heavily concentrated in a thinner sub-layer of the organic thin film layer).

(Measurement Result of Example 5)

The above-described current-voltage measurement for the Example 5 bulk heterojunction organic thin film solar cell showed that the short-circuit current density was 10.6 mA/cm$^2$, the open-circuit voltage was 0.57 V, the fill factor was 0.68 and the photoelectric conversion efficiency was 4.1%.

(Measurement Result of Comparative Example 3)

The above-described current-voltage measurement for the Comparative Example 3 bulk heterojunction organic thin film solar cell showed that the short-circuit current density was 7.9 mA/cm$^2$, the open-circuit voltage was 0.53 V, the fill factor was 0.60 and the photoelectric conversion efficiency was 2.5%.

(Effectiveness of Invention Confirmed by Measurement Results)

Comparison of Example 5 with Comparative Example 3 shows that by unevenly distributing the inorganic nanoparticles in the bulk heterojunction layer (organic thin film layer), the short-circuit current density can be increased and the photoelectric conversion efficiency can be improved.

Also, comparison of Example 1 with Example 5 shows that provision of an amorphous inorganic thin film containing some of the constituent elements of the inorganic nanoparticles can further improve the short-circuit current density and open-circuit voltage.

(Measurement Result of Example 6)

The above-described current-voltage measurement for the Example 6 bulk heterojunction organic thin film solar cell showed that the short-circuit current density was 9.2 mA/cm$^2$, the open-circuit voltage was 0.5 V, the fill factor was 0.65 and the photoelectric conversion efficiency was 3.0%.

(Measurement Result of Example 7)

The above-described current-voltage measurement for the Example 7 bulk heterojunction organic thin film solar cell showed that the short-circuit current density was 9.5 mA/cm$^2$, the open-circuit voltage was 0.57 V, the fill factor was 0.68 and the photoelectric conversion efficiency was 3.7%.

(Measurement Result of Comparative Example 4)

The above-described current-voltage measurement for the Comparative Example 4 bulk heterojunction organic thin film solar cell showed that the short-circuit current density was 8.7 mA/cm$^2$, the open-circuit voltage was 0.50 V, the fill factor was 0.60 and the photoelectric conversion efficiency was 2.6%.

(Measurement Result of Comparative Example 5)

The above-described current-voltage measurement for the Comparative Example 5 bulk heterojunction organic thin film solar cell showed that the short-circuit current density was 7.5 mA/cm$^2$, the open-circuit voltage was 0.57 V, the fill factor was 0.68 and the photoelectric conversion efficiency was 2.9%.

(Effectiveness of Invention Confirmed by Measurement Results)

Comparison of Example 6 with Comparative Example 4 as well as comparison of Example 7 with Comparative Example 5 show the following: In a solar cell having a bulk heterojunction layer containing a low-molecular-weight dye compound and an electron-accepting molecule, provision of inorganic nanoparticles which are unevenly concentrated along the thickness of the bulk heterojunction layer can increase the short-circuit current density and improve the photoelectric conversion efficiency.

The results of the above Examples and Comparative Examples are summarized in Tables 1 to 3.

TABLE 1

|  | Photoelectric Conversion Efficiency (%) | Short-Circuit Current Density (mA/cm$^2$) | Open-Circuit Voltage (V) | Fill Factor |
| --- | --- | --- | --- | --- |
| Example 1 | 3.6 | 10.5 | 0.5 | 0.68 |
| Example 2 | 1.2 | 8.5 | 0.35 | 0.40 |
| Example 3 | 2.6 | 8.7 | 0.5 | 0.60 |
| Example 4 | 3.1 | 9.0 | 0.5 | 0.68 |
| Comparative Example 1 | 2.0 | 6.7 | 0.5 | 0.60 |
| Comparative Example 2 | 1.5 | 7.5 | 0.4 | 0.50 |

TABLE 2

|  | Photoelectric Conversion Efficiency (%) | Short-Circuit Current Density (mA/cm$^2$) | Open-Circuit Voltage (V) | Fill Factor |
| --- | --- | --- | --- | --- |
| Example 5 | 4.1 | 10.6 | 0.57 | 0.68 |
| Comparative Example 1 | 2.0 | 6.7 | 0.5 | 0.60 |
| Comparative Example 2 | 1.5 | 7.5 | 0.4 | 0.50 |
| Comparative Example 3 | 2.5 | 7.9 | 0.53 | 0.60 |

TABLE 3

|  | Photoelectric Conversion Efficiency (%) | Short-Circuit Current Density (mA/cm$^2$) | Open-Circuit Voltage (V) | Fill Factor |
| --- | --- | --- | --- | --- |
| Example 6 | 3.0 | 9.2 | 0.5 | 0.65 |
| Example 7 | 3.7 | 9.5 | 0.57 | 0.68 |
| Comparative Example 4 | 2.6 | 8.7 | 0.5 | 0.60 |
| Comparative Example 5 | 2.9 | 7.5 | 0.57 | 0.68 |

As confirmed above, the present invention can contribute to an improvement in the efficiency of a bulk heterojunction organic thin film solar cell. The present invention can applied to thin film solar cells requiring such features as light-weight and flexibility.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An organic thin film solar cell comprising:
    positive and negative electrode layers; and
    a bulk heterojunction organic thin film layer disposed between the positive and negative electrode layers, the bulk heterojunction organic thin film layer including: a mixture of at least a first organic compound having a light-absorbing dye moiety and an electron-accepting second organic compound, the mixture being phase separated to form multiple junctions therebetween, wherein:
    the bulk heterojunction organic thin film layer further includes inorganic nanoparticles in the mixture; and
    the bulk heterojunction organic thin film layer has an uneven concentration distribution of the inorganic nanoparticles in the direction normal to the positive and negative electrode layers so that the inorganic nanoparticles are more heavily concentrated near the negative electrode layer than the positive electrode layer.

2. The organic thin film solar cell according to claim 1, wherein:
    the light-absorbing dye moiety has a π-conjugated structure.

3. The organic thin film solar cell according to claim 1, wherein:
    the inorganic nanoparticles have a primary particle diameter of 100 nm or less.

4. The organic thin film solar cell according to claim 1, wherein:
    the inorganic nanoparticles have electron-accepting properties.

5. The organic thin film solar cell according to claim 1, wherein:
    an amorphous inorganic thin film layer is further formed between the bulk heterojunction organic thin film layer and the negative electrode layer.

6. The organic thin film solar cell according to claim 5, wherein:
    the amorphous inorganic thin film layer contains at least one of the constituent elements of the inorganic nanoparticles.

7. An organic thin film solar cell comprising:
    positive and negative electrode layers;
    a bulk heterojunction organic thin film layer disposed between the positive and negative electrode layers, the bulk heterojunction organic thin film layer including a mixture of at least a first organic compound having a light-absorbing dye moiety and an electron-accepting second organic compound;
    a hole transport layer disposed between the positive electrode layer and the bulk heterojunction organic thin film layer; and
    a hole blocking layer disposed between the bulk heterojunction organic thin film layer and the negative electrode layer in order to suppress leakage of hole current from the bulk heterojunction organic thin film layer to the negative electrode layer, wherein:
    the bulk heterojunction organic thin film layer further includes inorganic nanoparticles in the mixture; and
    the bulk heterojunction organic thin film layer has an uneven concentration distribution of the inorganic nanoparticles in the direction normal to the positive and negative electrode layers so that the inorganic nanoparticles are more heavily concentrated near the negative electrode layer than the positive electrode layer.

8. The organic thin film solar cell according to claim 7, wherein:
    the hole blocking layer is an amorphous inorganic thin film layer.

9. The organic thin film solar cell according to claim 3, wherein:
    the inorganic nanoparticles have a primary particle diameter of several nanometers to several tens of nanometers.

10. The organic thin film solar cell according to claim 7, wherein:
    the light-absorbing dye moiety has a π-conjugated structure.

11. The organic thin film solar cell according to claim 7, wherein:
    the inorganic nanoparticles have a primary particle diameter of 100 nm or less.

12. The organic thin film solar cell according to claim 11, wherein:
    the inorganic nanoparticles have a primary particle diameter of several nanometers to several tens of nanometers.

13. The organic thin film solar cell according to claim 7, wherein:
    the inorganic nanoparticles have electron-accepting properties.

* * * * *